(12) United States Patent
Sekine et al.

(10) Patent No.: US 7,220,681 B2
(45) Date of Patent: May 22, 2007

(54) SEMICONDUCTOR DEVICE AND METHOD OF FABRICATING THE SAME

(75) Inventors: Katsuyuki Sekine, Kanagawa (JP); Akio Kaneko, Kanagawa (JP); Motoyuki Sato, Kanagawa (JP); Seiji Inumiya, Kanagawa (JP); Kazuhiro Eguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 11/049,671

(22) Filed: Feb. 4, 2005

(65) Prior Publication Data

US 2006/0094255 A1    May 4, 2006

(30) Foreign Application Priority Data

Nov. 1, 2004    (JP) .............................. 2004-317773

(51) Int. Cl.
*H01L 21/31*    (2006.01)
(52) U.S. Cl. ............................... 438/758; 257/E31.041
(58) Field of Classification Search ................ 438/591, 438/689, 769
See application file for complete search history.

(56) References Cited

U.S. PATENT DOCUMENTS 6,013,553 A * 1/2000 Wallace et al. ............. 438/287
6,613,658 B2 * 9/2003 Koyama et al. ............ 438/591
2005/0271813 A1 * 12/2005 Kher et al. ............... 427/248.1

FOREIGN PATENT DOCUMENTS

| JP | 9-312267 | 12/1997 |
|---|---|---|
| JP | 2002-118160 | 4/2002 |
| JP | 2003-068731 | 3/2003 |
| JP | 2004-071696 | 3/2004 |
| JP | 2004-186567 | 7/2004 |

OTHER PUBLICATIONS

Katsuyuki Sekine, et al.; "Nitrogen Profile Control by Plasma Nitridation Technique for Poly-Si Gate HfSiON CMOSFET with Excellent Interface Property and Ultra-low Leakage Current"; 2003 IEDM, Dig. Tech. Papers, pp. 103-106; (2003).

Notification of Reason for Rejection issued by the Japanese Patent Office on Feb. 6, 2007, for Japanese Patent Application No. 2004-317773, and English-language translation thereof.

* cited by examiner

*Primary Examiner*—Walter Lindsay, Jr.
*Assistant Examiner*—Elias Ullah
(74) *Attorney, Agent, or Firm*—Finnegan, Henderson, Farabow, Garrett & Dunner, L.L.P.

(57) ABSTRACT

A semiconductor device including a gate insulating film selectively formed on a predetermined region of a semiconductor substrate; a gate electrode formed on said gate insulating film; and a source region and drain region formed, in a surface portion of said semiconductor substrate, on two sides of a channel region positioned below said gate electrode; wherein a carbon concentration in an interface where said gate insulating film is in contact with said gate electrode is not more than $5 \times 10^{22}$ atoms/cm$^3$.

14 Claims, 6 Drawing Sheets

SEMICONDUCTOR DEVICE AND METHOD OF FABRICATING THE SAME

CROSS REFERENCE TO RELATED APPLICATION

This application is based upon and claims benefit of priority under 35 USC § 119 from the Japanese Patent Application No. 2004-317773, filed on Nov. 1, 2004, the entire contents of which are incorporated herein by reference.

BACKGROUND OF THE INVENTION

The present invention relates to a semiconductor device and a method of fabricating the same.

Recently, the electrical thickness of a gate insulating film decreases as the micropatterning of MOSFETs advances, and this poses the problem that a gate leakage current increases. To suppress this gate leakage current, therefore, a method which uses, as a gate insulating film, a high-dielectric-constant film having a relative dielectric constant higher than that of a silicon dioxide ($SiO_2$) film is proposed. A hafnium silicon oxynitride (HfSiON) film is an example of this high-dielectric-constant film.

The hafnium silicon oxynitride (HfSiON) film is formed by, e.g., forming a hafnium silicate ($HfSiO_x$) film on a semiconductor substrate, and nitriding the hafnium silicate ($HfSiO_x$) film by doping nitrogen (N) into it.

In the hafnium silicate ($HfSiO_x$) film, however, the bonding force between atoms is weak. Therefore, when nitrogen (N) is doped, bonding hands for bonding atoms are disconnected, and a large number of defects (holes) are formed.

When this hafnium silicon oxynitride (HfSiON) film is exposed to an oxidizing ambient or the atmosphere, atmospheric oxygen ($O_2$) or the like is activated by hafnium (Hf) as a catalyst, and oxygen radicals are produced. These oxygen radicals easily invade the hafnium silicon oxynitride (HfSiON) film or a semiconductor substrate.

Consequently, an interface insulating film having a low dielectric constant is formed between the hafnium silicon oxynitride (HfSiON) film and semiconductor substrate. This decreases the effective relative dielectric constant of the gate insulating film or increases the electrical thickness of the film.

In addition, since oxygen (O) replaces nitrogen (N) in the hafnium silicon oxynitride (HfSiON) film, nitrogen (N) is released from the hafnium silicon oxynitride (HfSiON) film.

As a consequence, the hafnium silicon oxynitride (HfSiON) film is separated into silicon dioxide ($SiO_2$) and hafnium dioxide ($HfO_2$), and these compounds crystallize. This decreases the heat resistance. Also, boron as a dopant readily breaks through the hafnium silicon oxynitride (HfSiON) film and diffuses into the semiconductor substrate. Furthermore, dielectric breakdown easily occurs, and this shortens the life of the gate insulating film.

These problems produce fluctuation in gate threshold voltage and variations in transistor characteristics.

A reference concerning a method of forming an insulating film having a high dielectric constant is as follows.

Japanese Patent Laid-Open No. 2004-71696

SUMMARY OF THE INVENTION

According to one aspect of the present invention, there is provided a semiconductor device fabrication method, comprising;

forming, in a film formation chamber, a first insulating film containing at least a metal and oxygen on a surface of a semiconductor substrate;

transferring the semiconductor substrate from the film formation chamber to a nitriding chamber via a transfer chamber;

forming, in the nitriding chamber, a second insulating film containing at least a metal, oxygen, and nitrogen by nitriding the first insulating film by doping nitrogen into it;

transferring the semiconductor substrate from the nitriding chamber to an annealing chamber via the transfer chamber;

performing predetermined annealing on the second insulating film in the annealing chamber; and transferring the semiconductor substrate from the annealing chamber to the transfer chamber, wherein when at least the semiconductor substrate is transferred from the nitriding chamber to the annealing chamber via the transfer chamber, an ambient selected from the group consisting of a reduced-pressure ambient at about $10^{-3}$ Torr, an inert gas ambient, and a nitrogen ambient is formed in the transfer chamber.

According to one aspect of the present invention, there is provided a semiconductor device fabrication method, comprising;

moving a transfer box containing a semiconductor substrate to a film formation chamber, and connecting the transfer box to the film formation chamber;

transferring the semiconductor substrate from the transfer box to the film formation chamber;

forming, in the film formation chamber, a first insulating film containing at least a metal and oxygen on a surface of the semiconductor substrate;

transferring the semiconductor substrate from the film formation chamber to the transfer box;

moving the transfer box containing the semiconductor substrate to a nitriding chamber, and connecting the transfer box to the nitriding chamber;

transferring the semiconductor substrate from the transfer box to the nitriding chamber;

forming, in the nitriding chamber, a second insulating film containing at least a metal, oxygen, and nitrogen by nitriding the first insulating film by doping nitrogen into it;

transferring the semiconductor substrate from the nitriding chamber to the transfer box;

moving the transfer box containing the semiconductor substrate to an annealing chamber, and connecting the transfer box to the annealing chamber;

transferring the semiconductor substrate from the transfer box to the annealing chamber;

performing predetermined annealing on the second insulating film in the annealing chamber; and transferring the semiconductor substrate from the annealing chamber to the transfer box, wherein when at least the semiconductor substrate is transferred from the nitriding chamber to the transfer box, the transfer box containing the semiconductor substrate is moved to the annealing chamber and the transfer box is connected to the annealing chamber, and the semiconductor substrate is transferred from the transfer box to the annealing chamber, an ambient selected from the group consisting of a reduced-pressure ambient at about $10^{-3}$ Torr, an inert gas ambient, and a nitrogen ambient is formed in the transfer box.

According to one aspect of the present invention, there is provided a semiconductor device, comprising:

a gate insulating film selectively formed on a predetermined region of a semiconductor substrate;

a gate electrode formed on said gate insulating film; and a source region and drain region formed, in a surface portion of said semiconductor substrate, on two sides of a channel region positioned below said gate electrode, wherein a carbon concentration in an interface where said gate insulating film is in contact with said gate electrode is not more than $5 \times 10^{22}$ atoms/cm$^3$.

DETAILED DESCRIPTION OF THE INVENTION

Embodiments of the present invention will be described below with reference to the accompanying drawings.

(1) First Embodiment

Figure 1:
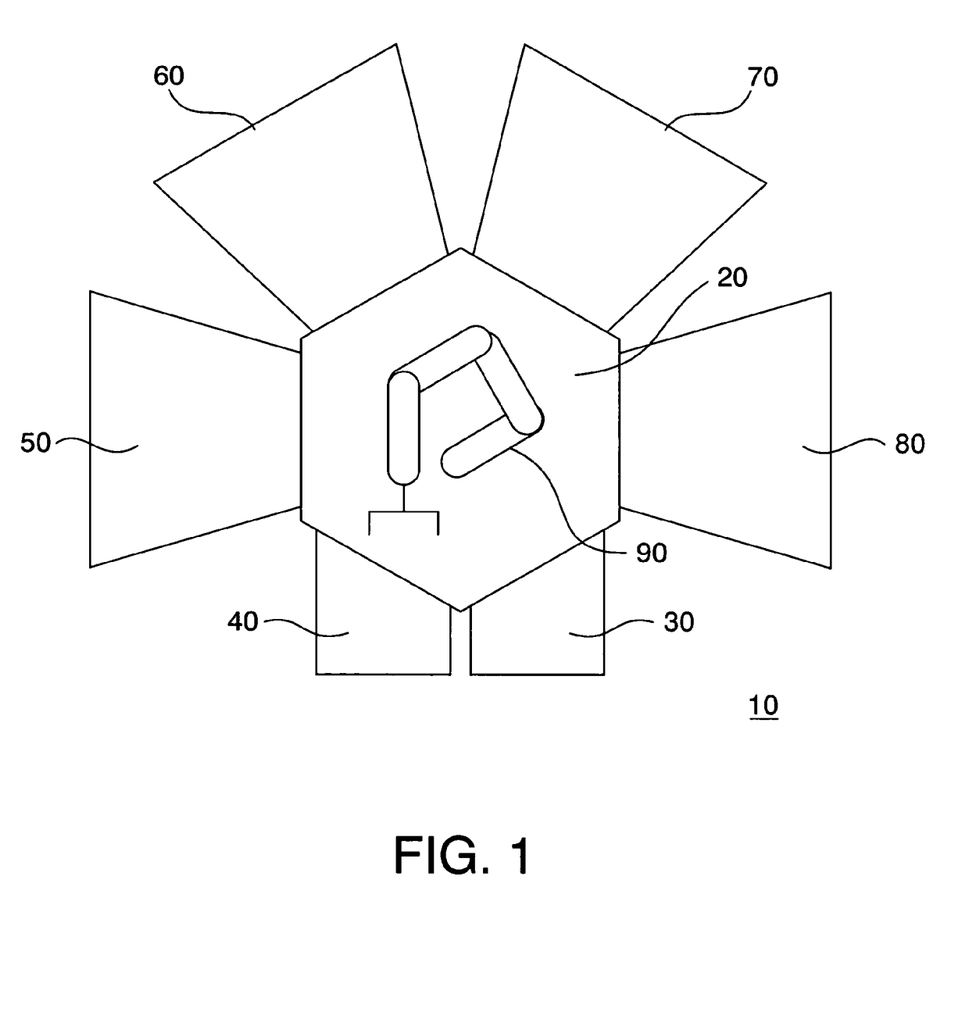
FIG. 1 is a block diagram showing the arrangement of a gate insulating film/gate electrode formation apparatus according to the first embodiment of the present invention.

FIG. 1 shows the arrangement of a gate insulating film/gate electrode formation apparatus 10 according to the first embodiment of the present invention. A transfer chamber 20 formed into a substantially octagonal shape is placed near a central portion of the gate insulating film/gate electrode formation apparatus 10. Around the transfer chamber 20, a loading chamber 30, unloading chamber 40, film formation chamber 50, nitriding chamber 60, annealing chamber 70, and gate insulating film/gate electrode formation chamber 80 are arranged.

The loading chamber 30 loads a semiconductor substrate into the transfer chamber 20 of the gate insulating film/gate electrode formation apparatus 10 from the outside. The unloading chamber 40 unloads a semiconductor substrate to the outside from the transfer chamber 20 of the gate insulating film/gate electrode formation apparatus 10.

A transfer mechanism 90 such as an arm is placed near a central portion of the transfer chamber 20, and transfers a semiconductor substrate between the chambers 30 to 80. The transfer chamber 20 also has an exhausting mechanism (not shown), so the interior of the transfer chamber 20 can be adjusted to a desired pressure. In addition, a gas supply source (not shown) is connected to the transfer chamber 20 and supplies a desired gas.

Accordingly, by forming, e.g., a reduced-pressure ambient at, e.g., about $10^{-3}$ Torr, an inert gas ambient such as argon, or a nitrogen ambient in the transfer chamber 20, a semiconductor substrate can be transferred to a desired one of the chambers 30 to 80 without being exposed to an oxidizing ambient or the atmosphere.

The film formation chamber 50 forms a hafnium silicate (HfSiO$_x$) film on a semiconductor substrate. The nitriding chamber 60 forms a hafnium silicon oxynitride (HfSiON) film by nitriding the hafnium silicate (HfSiO$_x$) film by doping nitrogen (N) into it.

The annealing chamber 70 performs predetermined annealing on the film formed on the semiconductor substrate. The gate insulating film/gate electrode formation chamber 80 deposits a film of a gate electrode material on the hafnium silicon oxynitride (HfSiON) film formed on the semiconductor substrate.

Note that similar to the transfer chamber 20, each of the chambers 30 to 80 has an exhausting mechanism and gas supply source (neither is shown). Therefore, different ambients can be independently formed in the chambers 20 to 80 of the gate insulating film/gate electrode formation apparatus 10.

Figure 2:
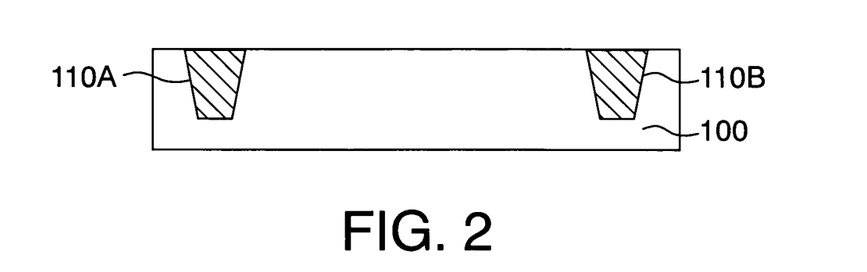
FIG. 2 is a longitudinal sectional view showing an element sectional structure in a predetermined step of a MOSFET fabrication method according to the embodiment of the present invention.

FIGS. 2 to 6 illustrate a method of forming a gate insulating film and gate electrode by using the gate insulating film/gate electrode formation apparatus 10 according to this embodiment. First, as shown in FIG. 2, element isolation insulating films 110A and 110B are formed on a semiconductor substrate 100, and a natural oxide film formed on the semiconductor substrate 100 is removed by washing using dilute hydrofluoric acid.

When the semiconductor substrate 100 from which the natural oxide film is thus removed is placed in the loading chamber 30 of the gate insulating film/gate electrode formation apparatus 10, the transfer mechanism 90 of the transfer chamber 20 unloads the semiconductor substrate 100 from the loading chamber 30. In this state, a reduced-pressure ambient at, e.g., about $10^{-3}$ Torr is formed in the transfer chamber 20 by the exhausting mechanism (not shown). It is also possible to form an inert gas ambient or nitrogen ambient in the transfer chamber 20 by supplying an inert gas such as argon or supplying nitrogen to the transfer chamber 20 from the gas supply source (not shown).

Figure 3:
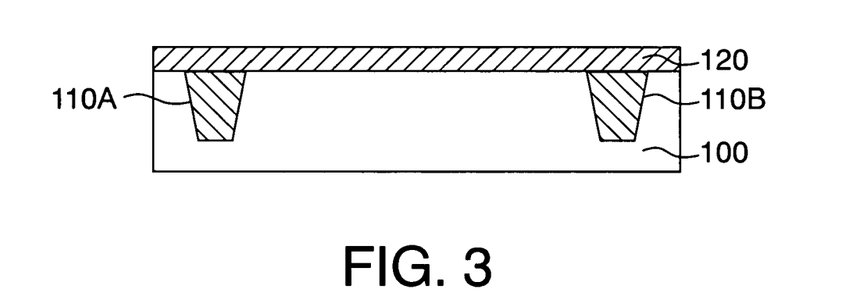
FIG. 3 is a longitudinal sectional view showing an element sectional structure in a predetermined step of the same MOSFET fabrication method.

The transfer mechanism 90 loads the semiconductor substrate 100 into the film formation chamber 50. As shown in FIG. 3, tetrakisdiethylaminohafnium (TDEAH), tetrakisdimethylaminosilicon (TDMAS), and oxygen, for example, are supplied to the film formation chamber 50, and the film formation chamber 50 forms a hafnium silicate (HfSiO$_x$) film 120 about 5 nm thick on the surface of the semiconductor substrate 100 by using MOCVD (Metal Organic Chemical Vapor Deposition). Note that the hafnium silicate (HfSiO$_x$) film 120 may also be formed by, e.g., sputtering or ALD (Atomic Layer Deposition), instead of MOCVD.

The transfer mechanism 90 unloads the semiconductor substrate 100 from the film formation chamber 50, and loads the semiconductor substrate 100 into the annealing chamber 70. The annealing chamber 70 anneals the hafnium silicate (HfSiO$_x$) film 120 in an oxidizing ambient at, e.g., 600 to 800° C., thereby improving the quality of the hafnium silicate (HfSiO$_x$) film 120. Note that this annealing may also be omitted.

The transfer mechanism 90 unloads the semiconductor substrate 100 from the annealing chamber 70, and loads the semiconductor substrate 100 into the nitriding chamber 60. The nitriding chamber 60 nitrides the hafnium silicate (HfSiO$_x$) film 120 by supplying nitrogen at 10 to 25 at % by using a nitrogen-containing plasma, thereby forming a hafnium silicon oxynitride (HfSiON) film 120. Note that at % represents an atomic composition ratio.

Although nitrogen is supplied by using a nitrogen-containing plasma in this embodiment, nitrogen may also be supplied to the hafnium silicate (HfSiO$_x$) film 120 by annealing by using a nitrogen-containing gas.

The transfer mechanism 90 unloads the semiconductor substrate 100 from the nitriding chamber 60, and loads the semiconductor substrate 100 into the annealing chamber 70.

In the hafnium silicate (HfSiO$_x$) film 120, the bonding force between atoms is weak. When nitrogen (N) is supplied, therefore, bonding hands for bonding atoms are disconnected, and a large number of defects are formed.

Accordingly, the annealing chamber 70 anneals the semiconductor substrate 100 in a nitrogen ambient at, e.g., 800 to 1,000° C., thereby restoring a number of defects formed in the hafnium silicon oxynitride (HfSiON) film 120.

Note that if the hafnium silicon oxynitride (HfSiON) film 120 having a large number of defects is exposed to an oxidizing ambient or the atmosphere, oxygen radicals activated by hafnium (Hf) as a catalyst invade the hafnium silicon oxynitride (HfSiON) film or semiconductor substrate to deteriorate the transistor characteristics.

In this embodiment, however, a reduced-pressure ambient at about 10$^{-3}$ Torr, an inert gas ambient, or a nitrogen ambient is formed in the transfer chamber 20. Therefore, when the transfer mechanism 90 of the transfer chamber 20 transfers the semiconductor substrate 100 from the nitriding chamber 60 to the annealing chamber 70, the semiconductor substrate 100 is not exposed to an oxidizing ambient or the atmosphere.

This makes it possible to suppress deterioration and variations of the transistor characteristics, and thereby increase the yield.

To suppress deterioration of the transistor characteristics, a reduced-pressure ambient at about 10$^{-3}$ Torr, an inert gas ambient, or a nitrogen ambient need only be formed in the transfer chamber 20 at least while the semiconductor substrate 100 is transferred from the nitriding chamber 60 to the annealing chamber 70.

Figure 4:
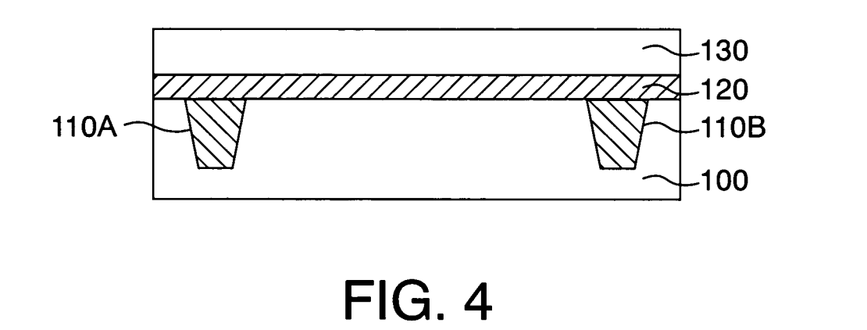
FIG. 4 is a longitudinal sectional view showing an element sectional structure in a predetermined step of the same MOSFET fabrication method.

The transfer mechanism 90 unloads the semiconductor substrate 100 from the annealing chamber 70, and loads the semiconductor substrate 100 into the gate insulating film/gate electrode formation chamber 80. As shown in FIG. 4, the gate insulating film/gate electrode formation chamber 80 heats the semiconductor substrate 100 to about 700° C., and forms a polysilicon film 130 about 150 nm thick on the hafnium silicon oxynitride (HfSiON) film 120 by using monosilane (SiH$_4$) gas. Note that the gate electrode material is not limited to polysilicon, and it is also possible to use, e.g., amorphous silicon, silicon germanium, or a metal.

The transfer mechanism 90 unloads the semiconductor substrate 100 from the gate insulating film/gate electrode formation chamber 80, and places the semiconductor substrate 100 in the unloading chamber 40. The semiconductor substrate 100 is then taken out from the gate insulating film/gate electrode formation apparatus 10, and patterned.

Figure 5:
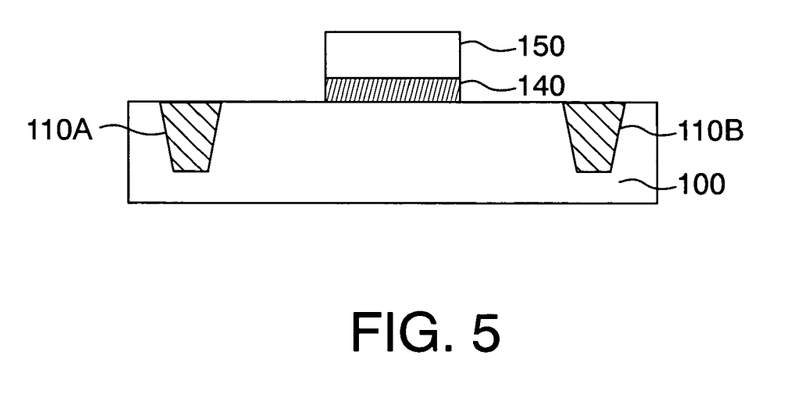
FIG. 5 is a longitudinal sectional view showing an element sectional structure in a predetermined step of the same MOSFET fabrication method.

As shown in FIG. 5, photolithography, RIE (Reactive Ion Etching), or the like is executed to form a gate insulating film 140 made of the hafnium silicon oxynitride (HfSiON) film and a gate electrode 150 made of the polysilicon film.

Figure 6:
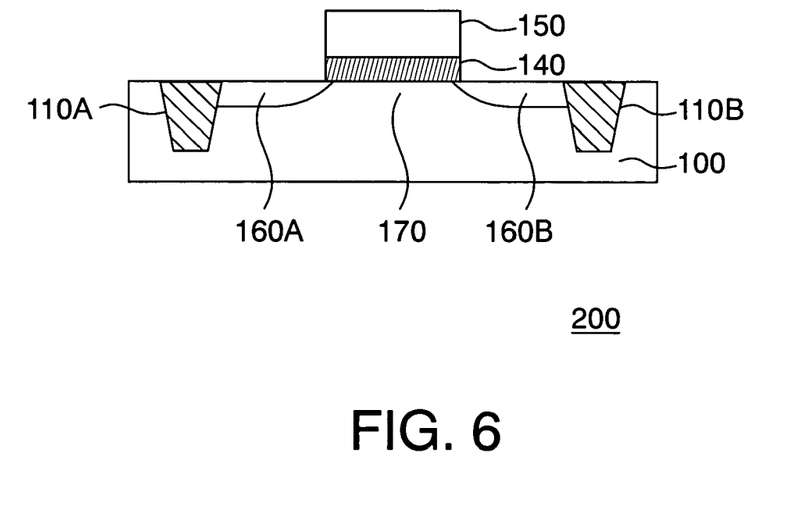
FIG. 6 is a longitudinal sectional view showing an element sectional structure in a predetermined step of the same MOSFET fabrication method.

As shown in FIG. 6, a dopant is ion-implanted into the surfaces of the gate electrode 150 and semiconductor substrate 100, and annealing is performed to form a source region 160A and drain region 160B.

In a MOSFET 200 fabricated by the above method, as shown in FIG. 6, the element isolation insulating films 110A and 110B for element isolation are formed in the surface portion of the semiconductor substrate 100, and the gate electrode 150 made of the polysilicon film is formed, via the gate insulating film 140 formed by the hafnium silicon oxynitride (HfSiON) film on the surface of the semiconductor substrate 100, near a central portion of an element region isolated by the element isolation insulating films 110A and 110B.

In this structure, the carbon concentration in the interface where the gate electrode 140 is in contact with the gate electrode 150 is 5×10$^{22}$ atoms/cm$^3$ or less.

As described above, when the semiconductor substrate 100 is transferred from the nitriding chamber 60 to the annealing chamber 70, a reduced-pressure ambient at about 10$^{-3}$ Torr, an inert gas ambient, or a nitrogen ambient is formed in the transfer chamber 20. Compared to a case in which the semiconductor substrate 100 is exposed to the atmosphere or the like, it is possible to suppress adhesion of organic materials discharged from substances in the clean room and floating, and decrease the carbon concentration in the interface where the gate insulating film 140 is in contact with the gate electrode.

This makes it possible to prevent dielectric breakdown of the gate insulating film, and improve the reliability of the gate insulating film 140.

Especially in devices from the 65-nm generation, the influence of defects such as dielectric breakdown caused by carbon in the interface is large. Therefore, the reliability of devices can be improved by applying this embodiment.

Also, a channel region 170 is formed below the gate electrode 150 and close to the surface of the semiconductor substrate 100.

The source region 160A is formed between the channel region 170 and element isolation insulating film 110A, and the drain region 160B is formed between the channel region 170 and element isolation insulating film 110B.

Figure 7:
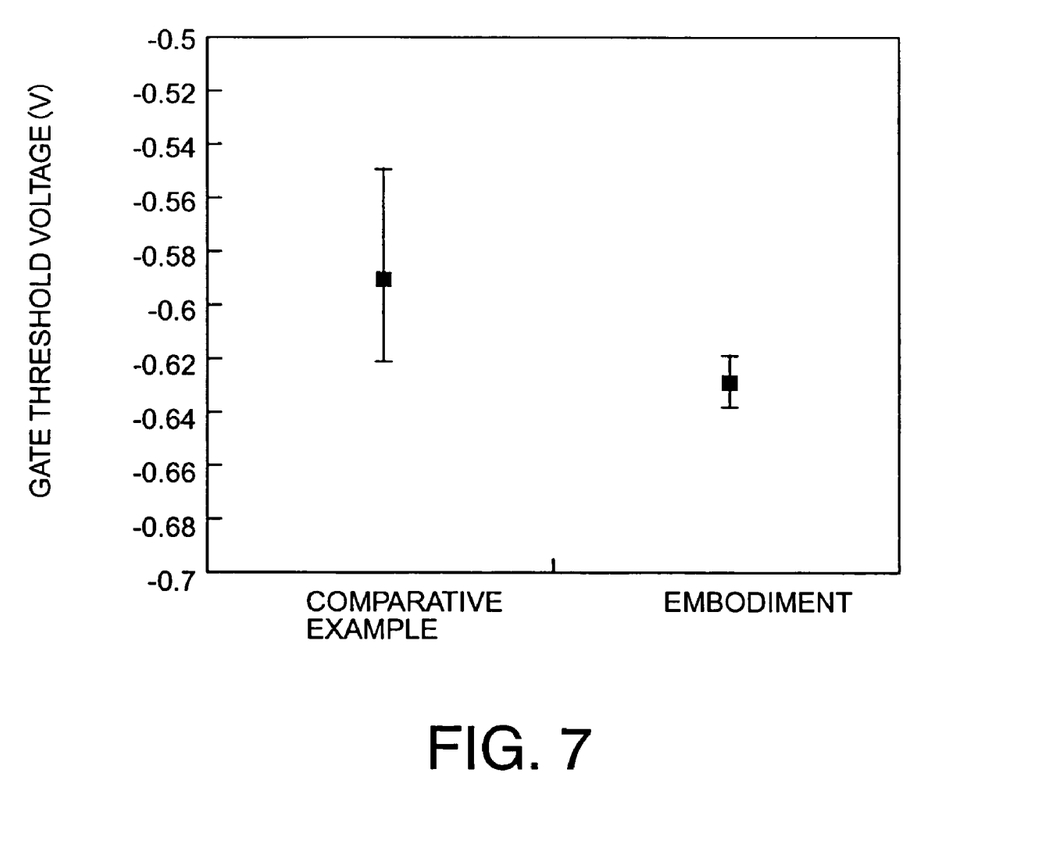
FIG. 7 is a graph showing the distributions of the gate threshold voltages of MOSFETs in this embodiment in which a semiconductor substrate was not exposed to an oxidizing ambient or the atmosphere, and in a comparative example in which a semiconductor substrate was exposed to an oxidizing ambient or the atmosphere.

FIG. 7 shows the distributions of the gate threshold voltages of MOSFETs fabricated by cutting the semiconductor substrate 100 in this embodiment in which the semiconductor substrate 100 was not exposed to an oxidizing ambient or the atmosphere when it was transferred from the nitriding chamber 60 to the annealing chamber 70, and in a comparative example in which the semiconductor substrate 100 was exposed to an oxidizing ambient or the atmosphere.

As shown in FIG. 7, in the comparative example in which the substrate 100 was exposed to an oxidizing ambient or the atmosphere when it was transferred from the nitriding chamber 60 to the annealing chamber 70, the gate threshold voltage of each MOSFET fabricated from the semiconductor substrate 100 existed within the range of −0.62 V to −0.54 V. That is, the variation was very large, and accordingly the yield was low.

By contrast, in this embodiment in which the substrate 100 was not exposed to an oxidizing ambient or the atmosphere when it was transferred from the nitriding chamber 60 to the annealing chamber 70, it was possible to make the variation in gate threshold voltage much smaller than that in the comparative example, and greatly increase the yield accordingly.

Figure 8:
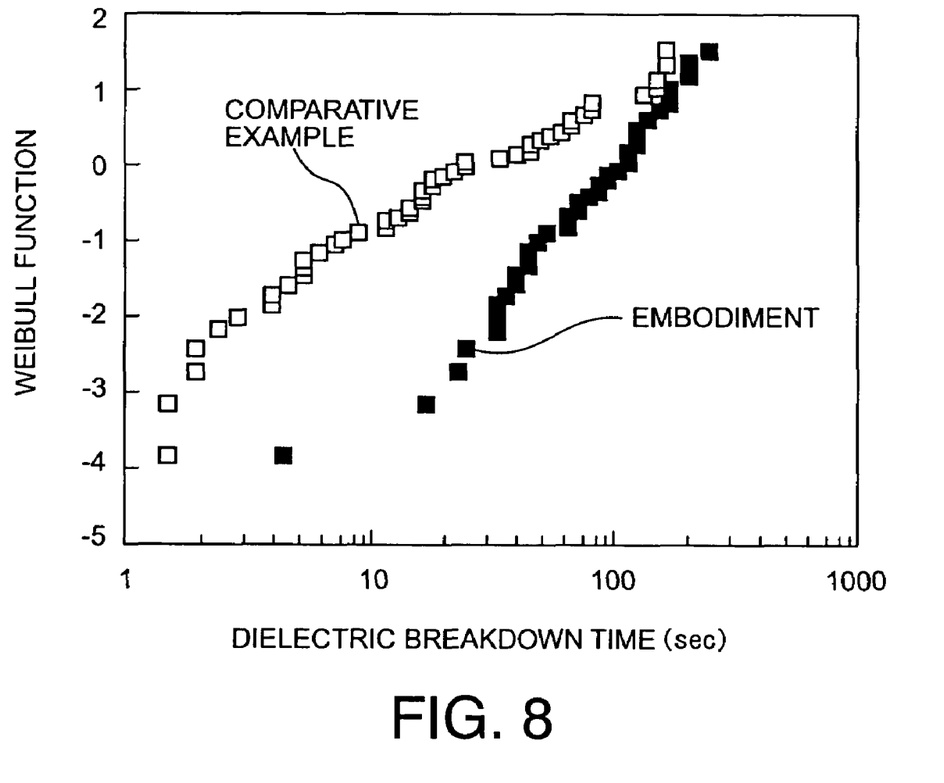
FIG. 8 is a graph showing the time-dependent dielectric breakdown (TDDB) characteristics of the MOSFETs in this embodiment in which the semiconductor substrate was not exposed to an oxidizing ambient or the atmosphere, and in the comparative example in which the semiconductor substrate was exposed to an oxidizing ambient or the atmosphere.

Also, FIG. 8 shows the time-dependent dielectric breakdown (TDDB) characteristics of MOSFETs fabricated as they were cut from the semiconductor substrate 100 in this embodiment in which the semiconductor substrate 100 was not exposed to an oxidizing ambient or the atmosphere when it was transferred from the nitriding chamber 60 to the annealing chamber 70, and in the comparative example in which the semiconductor substrate 100 was exposed to an oxidizing ambient or the atmosphere.

More specifically, electrons were injected from the semiconductor substrate 100 to the gate insulating film 140, and a stress electric field of 12 MV/cm was applied to the gate insulating film 140. After that, the dielectric breakdown time of each MOSFET was measured. Note that the abscissa indicates the dielectric breakdown time of each MOSFET, and the ordinate indicates a Weibull function (i.e., the dielectric breakdown probability).

As shown in FIG. 8, in the comparative example in which the substrate 100 was exposed to an oxidizing ambient or the atmosphere when it was transferred from the nitriding chamber 60 to the annealing chamber 70, the dielectric breakdown times of many MOSFETs fabricated from the semiconductor substrate 100 were short, and the life of the gate insulating film 140 was also short. In addition, the variation in dielectric breakdown time was large, so the reliability of the transistors was low.

By contrast, in this embodiment in which the substrate 100 was not exposed to an oxidizing ambient or the atmosphere when it was transferred from the nitriding chamber 60 to the annealing chamber 70, the dielectric breakdown times of many MOSFETs were longer than those of the comparative example, and the life of the gate insulating film 140 was long accordingly. In addition, the variation in dielectric breakdown time was smaller than that of the comparative example, so the reliability of the transistors was high.

(Second Embodiment)

Figure 9:
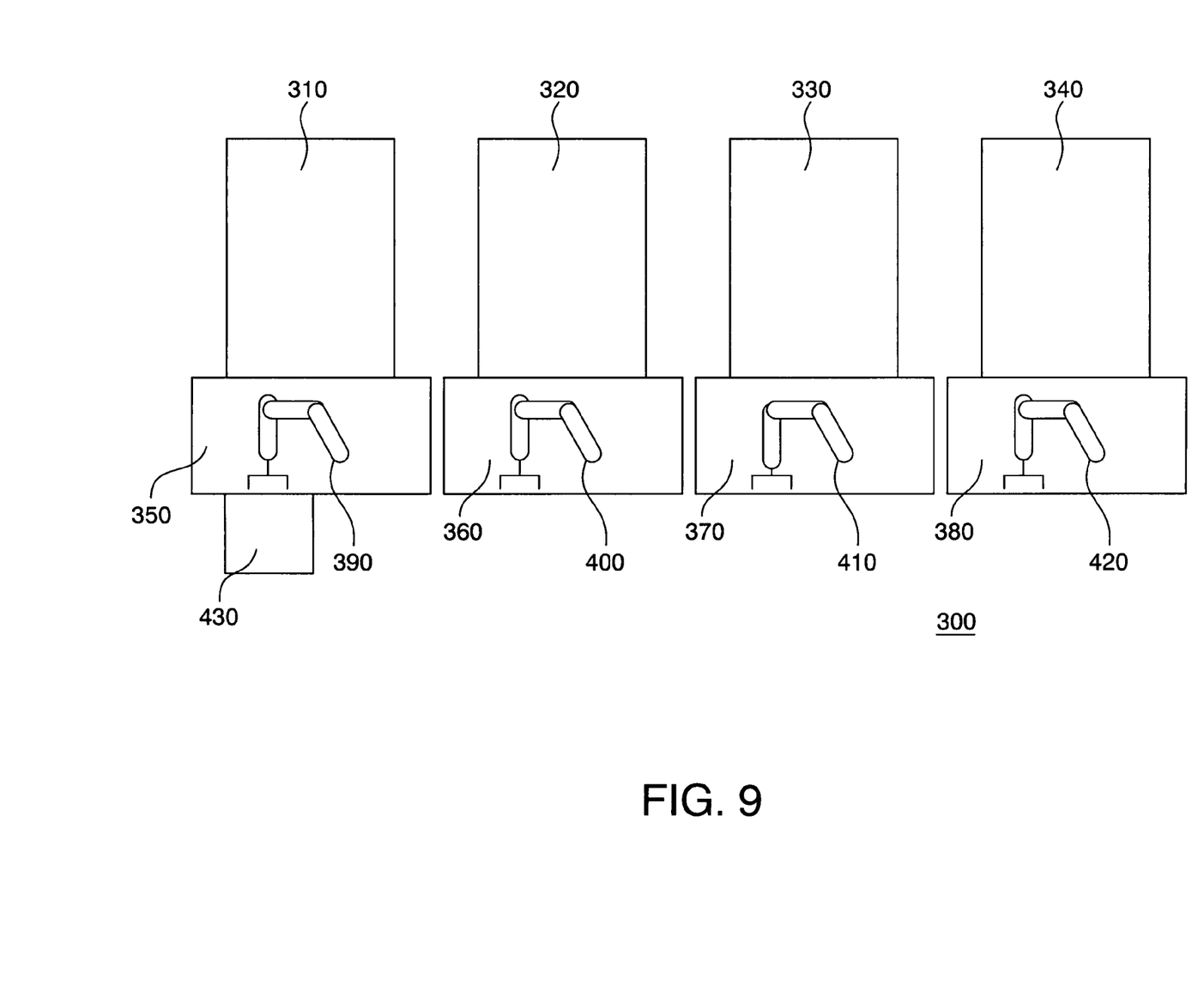
FIG. 9 is a block diagram showing the arrangement of a gate insulating film/gate electrode formation apparatus according to the second embodiment of the present invention.

FIG. 9 shows the arrangement of a gate insulating film/gate electrode formation apparatus 300 according to the second embodiment of the present invention. In the gate insulating film/gate electrode formation apparatus 300, a film formation chamber 310, nitriding chamber 320, annealing chamber 330, and gate insulating film/gate electrode formation chamber 340 are arranged in predetermined positions, and transfer chambers 350, 360, 370, and 380 are connected to the chambers 310, 320, 330, and 340, respectively.

Transfer mechanisms 390, 400, 410, and 420 are arranged in the transfer chambers 350, 360, 370, and 380, respectively, and load/unload a semiconductor substrate 100 into/from the chambers 310, 320, 330, and 340, respectively.

The transfer chambers 350 to 380 each have an exhausting mechanism (not shown), so the interior of each of the transfer chambers 350 to 380 can be adjusted to a desired pressure. In addition, a gas supply source (not shown) is connected to each of the transfer chambers 350 to 380, and supplies a desired gas.

Accordingly, by forming, e.g., a reduced-pressure ambient at, e.g., about $10^{-3}$ Torr, an inert gas ambient such as argon, or a nitrogen ambient in each of the transfer chambers 350 to 380, the semiconductor substrate 100 can be loaded/unloaded into/from each of the chambers 310 to 340 without being exposed to an oxidizing ambient or the atmosphere.

A transfer box 430 transfers the semiconductor substrate 100 to a desired one of the transfer chambers 350 to 380. Similar to the transfer chambers 350 to 380, the transfer box 430 has an exhausting mechanism (not shown), so the interior of the transfer box 430 can be adjusted to a desired pressure. In addition, a gas supply source (not shown) is connected to the transfer box 430, and supplies a desired gas.

Accordingly, by forming, e.g., a reduced-pressure ambient at, e.g., about $10^{-3}$ Torr, an inert gas ambient such as argon, or a nitrogen ambient in the transfer box 430, the semiconductor substrate 100 can be transferred to a desired one of the chambers 350 to 380 without being exposed to an oxidizing ambient or the atmosphere.

A method of forming a gate insulating film and gate electrode by using the gate insulating film/gate electrode formation apparatus 300 according to this embodiment will be described below with reference to FIGS. 2 to 6 used in the explanation of the first embodiment. Note that processes executed in the chambers 310 to 340 are the same as the processes executed in the corresponding chambers 50 to 80 of the gate insulating film/gate electrode formation apparatus 10 according to the first embodiment.

First, a semiconductor substrate 100 in which element isolation insulating films 110A and 110B are formed and from which a natural oxide film is removed is put in the transfer box 430, and the transfer box 430 is moved to and connected to the transfer chamber 350.

The transfer mechanism 390 of the transfer chamber 350 unloads the semiconductor substrate 100 from the transfer box 430, and loads the semiconductor substrate 100 into the film formation chamber 310. As shown in FIG. 3, the film formation chamber 310 forms a hafnium silicate (HfSiO$_x$) film 120 on the surface of the semiconductor substrate 100 by using, e.g., MOCVD.

The transfer mechanism 390 unloads the semiconductor substrate 100 from the film formation chamber 310, and puts the semiconductor substrate 100 in the transfer box 430. The transfer box 430 is moved to and connected to the transfer chamber 370.

The transfer mechanism 410 of the transfer chamber 370 unloads the semiconductor substrate 100 from the transfer box 430, and loads the semiconductor substrate 100 into the annealing chamber 330. The annealing chamber 330 improves the quality of the hafnium silicate (HfSiO$_x$) film 120 by annealing it. Note that this annealing may also be omitted.

The transfer mechanism 410 unloads the semiconductor substrate 100 from the annealing chamber 330, and puts the semiconductor substrate 100 in the transfer box 430. The transfer box 430 is moved to and connected to the transfer chamber 360.

The transfer mechanism 400 of the transfer chamber 360 unloads the semiconductor substrate 100 from the transfer box 430, and loads the semiconductor substrate 100 into the nitriding chamber 320. The nitriding chamber 320 nitrides the hafnium silicate (HfSiO$_x$) film 120 by supplying nitrogen to it, thereby forming a hafnium silicon oxynitride (HfSiON) film 120.

The transfer mechanism 400 unloads the semiconductor substrate 100 from the nitriding chamber 320, and puts the semiconductor substrate 100 in the transfer box 430. The transfer box 430 is moved to and connected to the transfer chamber 370. The transfer mechanism 410 of the transfer chamber 370 unloads the semiconductor substrate 100 from the transfer box 430, and loads the semiconductor substrate 100 into the annealing chamber 330.

In this embodiment, a reduced-pressure ambient at about $10^{-3}$ Torr, an inert gas ambient, or a nitrogen ambient is formed in the transfer box 430 and the transfer chambers 360 and 370. Therefore, the semiconductor substrate 100 can be transferred from the nitriding chamber 320 to the annealing chamber 330 without being exposed to an oxidizing ambient or the atmosphere.

This makes it possible to suppress deterioration and variations of the transistor characteristics, and thereby increase the yield.

To suppress deterioration of the transistor characteristics, a reduced-pressure ambient at about $10^{-3}$ Torr, an inert gas ambient, or a nitrogen ambient need only be formed in the transfer chamber 360, transfer box 430, and transfer chamber 370 at least while the semiconductor substrate 100 is transferred from the nitriding chamber 320 to the annealing chamber 330.

The annealing chamber 330 restores a large number of defects formed in the hafnium silicon oxynitride (HfSiON) film 120 by annealing the semiconductor substrate 100 in a nitrogen ambient.

The transfer mechanism 410 unloads the semiconductor substrate 100 from the annealing chamber 330, and puts the semiconductor substrate 100 in the transfer box 430. The transfer box 430 is moved to and connected to the transfer chamber 380.

The transfer mechanism 420 of the transfer chamber 380 unloads the semiconductor substrate 100 from the transfer box 430, and loads the semiconductor substrate 100 into the gate insulating film/gate electrode formation chamber 340. As shown in FIG. 4, the gate insulating film/gate electrode formation chamber 340 forms a polysilicon film 130 on the hafnium silicon oxynitride (HfSiON) film 120.

The transfer mechanism 420 unloads the semiconductor substrate 100 from the gate insulating film/gate electrode formation chamber 340, and puts the semiconductor substrate 100 in the transfer box 430. Then, the semiconductor substrate 100 is taken out from the gate insulating film/gate electrode formation apparatus 300.

As shown in FIG. 5, a gate insulating film 140 and gate electrode 150 are formed by patterning the polysilicon film 130 and hafnium silicon oxynitride (HfSiON) film 120. After that, a source region 160A and drain region 160B are formed as shown in FIG. 6, thereby fabricating a MOSFET 200.

In the MOSFET fabricated by the above method, as in the first embodiment, the carbon concentration in the interface where the gate insulating film 140 is in contact with the gate electrode 150 is $5 \times 10^{22}$ atoms/cm$^3$ or less. This achieves the same effects as in the first embodiment.

The semiconductor devices and their fabrication methods of the embodiments described above can suppress variations in transistor characteristics and increase the yield.

Note that the above embodiments are merely examples and do not limit the present invention. For example, instead of hafnium (Hf), another metal such as zirconium may also be used. That is, it is also possible to form an insulating film containing at least a metal and oxygen on a semiconductor substrate, and nitride this insulating film to form an insulating film containing at least the metal, oxygen, and nitrogen.

Also, in the above embodiments, the film formation chambers 50 and 310 and nitriding chambers 60 and 320 are different reaction chambers. However, these chambers may also be one reaction chamber.

The invention claimed is:

1. A semiconductor device fabrication method, comprising:

forming, in a film formation chamber, a first insulating film containing at least a metal and oxygen on a surface of a semiconductor substrate;

transferring the semiconductor substrate from the film formation chamber to a nitriding chamber via a transfer chamber;

forming, in the nitriding chamber, a second insulating film containing at least a metal, oxygen, and nitrogen by nitriding the first insulating film by doping nitrogen into it;

transferring the semiconductor substrate from the nitriding chamber to an annealing chamber via the transfer chamber;

performing predetermined annealing on the second insulating film in the annealing chamber; and transferring the semiconductor substrate from the annealing chamber to the transfer chamber, wherein when at least when the semiconductor substrate is transferred from the nitriding chamber to the annealing chamber via the transfer chamber, an ambient selected from the group consisting of a reduced-pressure ambient at about $10^{-3}$ Torr, an inert gas ambient, and a nitrogen ambient is formed in the transfer chamber.

2. A method according to claim 1, further, comprising:

transferring the semiconductor substrate from the transfer chamber to a gate electrode formation chamber, after the semiconductor substrate is transferred from the annealing chamber to the transfer chamber; and depositing a film of a gate electrode material on the second insulating film in the gate electrode formation chamber.

3. A method according to claim 1, further comprising, transferring the semiconductor substrate to the annealing chamber before the semiconductor substrate is transferred from the film formation chamber to the nitriding chamber via the transfer chamber, and transferring the semiconductor substrate to the nitriding chamber after predetermined annealing is performed on the first insulating film.

4. A method according to claim 1, wherein when the first insulating film is formed, the first insulating film containing a metal, oxygen, and silicon is formed on the surface of the semiconductor substrate in the film formation chamber.

5. A method according to claim 1, wherein
when the first insulating film is formed, a hafnium silicate film is formed on the surface of the semiconductor substrate in the film formation chamber, and
when the second insulating film is formed, a hafnium silicon oxynitride film is formed in the nitriding chamber by nitriding the hafnium silicate film by doping nitrogen into it.

6. A method according to claim 1, wherein when the second insulating film is formed, the first insulating film is nitrided by doping nitrogen by using a nitrogen-containing plasma.

7. A method according to claim 1, wherein when the second insulating film is formed, the second insulating film having a specific dielectric constant higher than that of a silicon dioxide film is formed.

8. A semiconductor device fabrication method, comprising:

moving a transfer box containing a semiconductor substrate to a film formation chamber, and connecting the transfer box to the film formation chamber;

transferring the semiconductor substrate from the transfer box to the film formation chamber;

forming, in the film formation chamber, a first insulating film containing at least a metal and oxygen on a surface of the semiconductor substrate;

transferring the semiconductor substrate from the film formation chamber to the transfer box;

moving the transfer box containing the semiconductor substrate to a nitriding chamber, and connecting the transfer box to the nitriding chamber;

transferring the semiconductor substrate from the transfer box to the nitriding chamber;

forming, in the nitriding chamber, a second insulating film containing at least a metal, oxygen, and nitrogen by nitriding the first insulating film by doping nitrogen into it;

transferring the semiconductor substrate from the nitriding chamber to the transfer box;

moving the transfer box containing the semiconductor substrate to an annealing chamber, and connecting the transfer box to the annealing chamber;

transferring the semiconductor substrate from the transfer box to the annealing chamber;

performing predetermined annealing on the second insulating film in the annealing chamber; and transferring the semiconductor substrate from the annealing chamber to the transfer box, wherein when at least the semiconductor substrate is transferred from the nitriding chamber to the transfer box, the transfer box containing the semiconductor substrate is moved to the annealing chamber and the transfer box is connected to the annealing chamber, and the semiconductor substrate is transferred from the transfer box to the annealing chamber, an ambient selected from the group consisting of a reduced-pressure ambient at about $10^{-3}$ Torr, an inert gas ambient, and a nitrogen ambient is formed in the transfer box.

9. A method according to claim 8, further, comprising:

moving the transfer box containing the semiconductor substrate to a gate electrode formation chamber, and connecting the transfer box to the gate insulating film/gate electrode formation chamber, after the semiconductor substrate is transferred from the annealing chamber to the transfer box; and depositing a film of a gate electrode material on the second insulating film in the gate electrode formation chamber.

10. A method according to claim 8, further comprising:

moving the transfer box containing the semiconductor substrate to the annealing chamber before the transfer box containing the semiconductor substrate is moved to the nitriding chamber;

transferring the semiconductor substrate from the transfer box to the annealing chamber;

performing predetermined annealing on the second insulating film in the annealing chamber;

transferring the semiconductor substrate from the annealing chamber to the transfer box; and transferring the transfer box containing the semiconductor substrate to the nitriding chamber.

11. A method according to claim 8, wherein when the first insulating film is formed, the first insulating film containing a metal, oxygen, and silicon is formed on the surface of the semiconductor substrate in the film formation chamber.

12. A method according to claim 8, wherein when the first insulating film is formed, a hafnium silicate film is formed on the surface of the semiconductor substrate in the film formation chamber, and when the second insulating film is formed, a hafnium silicon oxynitride film is formed in the nitriding chamber by nitriding the hafnium silicate film by doping nitrogen into it.

13. A method according to claim 8, wherein when the second insulating film is formed, the first insulating film is nitrided by doping nitrogen by using a nitrogen-containing plasma.

14. A method according to claim 8, wherein when the second insulating film is formed, the second insulating film having a specific dielectric constant higher than that of a silicon dioxide film is formed.

* * * * *